(12) United States Patent
Yamamoto et al.

(10) Patent No.: US 7,705,658 B2
(45) Date of Patent: Apr. 27, 2010

(54) WAVE DETECTOR CIRCUIT

(75) Inventors: Kazuya Yamamoto, Tokyo (JP); Miyo Miyashita, Tokyo (JP); Takayuki Matsuzuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/748,601

(22) Filed: May 15, 2007

(65) Prior Publication Data

US 2008/0174356 A1    Jul. 24, 2008

(30) Foreign Application Priority Data

Dec. 13, 2006    (JP)    ............... 2006-335861

(51) Int. Cl.
*H03K 17/60*    (2006.01)
(52) U.S. Cl. ............... 327/478; 327/83; 327/80; 330/289; 330/298
(58) Field of Classification Search ............ 327/61, 327/80–83, 478, 447, 513; 330/285, 289, 330/298, 300
See application file for complete search history.

(56) References Cited

U.S. PATENT DOCUMENTS

| | | | |
|---|---|---|---|
| 4,513,209 A | 4/1985 | Tanabe et al. | |
| 6,720,831 B2 * | 4/2004 | Dening et al. | 330/298 |
| 6,822,515 B2 * | 11/2004 | Ichitsubo et al. | 330/285 |
| 7,071,783 B2 * | 7/2006 | Ichitsubo et al. | 330/285 |
| 7,253,681 B2 * | 8/2007 | Ichitsubo et al. | 330/140 |
| 7,440,734 B1 * | 10/2008 | Jones et al. | 327/61 |

FOREIGN PATENT DOCUMENTS

| | | |
|---|---|---|
| DE | 31 35 249 A1 | 1/1984 |
| DE | 32 05 286 C2 | 3/1986 |
| EP | 1 050 956 | 11/2000 |
| JP | 2-80972 | 3/1990 |
| JP | 2-100504 A | 4/1990 |
| JP | 2005-109644 | 4/2005 |
| WO | WO 99/37019 | 7/1999 |

* cited by examiner

*Primary Examiner*—Long Nguyen
(74) *Attorney, Agent, or Firm*—Leydig, Voit & Mayer, Ltd.

(57) ABSTRACT

A wave detector circuit includes: a first transistor having its base and collector connected together, the first transistor receiving an AC signal and a reference voltage at its base and collector; a second transistor having its base connected to the base of the first transistor through a resistor, the second transistor outputting a detected voltage at its collector; and a diode-connected temperature compensation transistor connected between ground potential and the base and the collector of the first transistor.

9 Claims, 14 Drawing Sheets

WAVE DETECTOR CIRCUIT

FIELD OF THE INVENTION

The present invention relates to a wave detector circuit that can be integrated on the same substrate as a GaAs-HBT power amplifier and that can detect an RF power signal having a low voltage amplitude and exhibit reduced variation in detected voltage with temperature.

BACKGROUND ART

GaAs-HBT (Heterojunction Bipolar Transistor) power amplifiers have been widely used as cellular phone power amplifiers for CDMA, etc. and as wireless LAN power amplifiers. Unlike GaAs-FET power amplifiers, GaAs-HBT power amplifiers do not require a negative gate bias voltage, which allows them to operate on a single power source. Furthermore, their device characteristics do not vary as much as those of GaAs-FET power amplifiers.

FIGS. 23, 24, and 25 are circuit diagrams of GaAs-HBT power amplifiers. In these figures, symbol IN denotes an input terminal; OUT, an output terminal; $Tr_{11}$, $Tr_{12}$, and $Tr_{13}$, GaAs-HBTs; $C_{c1}$, $C_{c2}$, and $C_{c3}$, capacitances; $V_{c1}$, $V_{c2}$, and $V_{c3}$, power supply voltages; $R_0$, $R_1$, $R_2$, and $R_3$, resistors; IM1, IS1, IS2, OM1, matching circuits; and Coup1, a directional coupler. The wave detector circuit for monitoring the output power of such a power amplifier is mounted on the board of the terminal device or in the power amplifier module (see, e.g., Japanese Laid-Open Patent Publication Nos. 2-80972 and 2005-109644 and International Patent Application Publication No. WO 99/37019).

The wave detector circuits shown in FIGS. 23 and 24 directly monitor the RF power at the collector and the base, respectively, of the final stage transistor $Tr_{13}$. The wave detector circuit shown in FIG. 25, on the other hand, monitors the RF power through the coupler Coup1, which allows accurate monitoring of the power of the forward propagating wave.

The power monitoring circuit shown in FIG. 23 is simple and may be used when the accuracy requirements are not so stringent, since the power monitored by the wave detector circuit includes reflected wave power when a load change occurs. For example, it is relatively common to use this power monitoring circuit in a LAN terminal, which is less mobile than a cellular phone. On the other hand, the power monitoring circuit shown in FIG. 24 does not monitor the output power from the final stage, since the wave detector circuit is provided on the base side of the final stage transistor $Tr_{13}$, as described above, resulting in slightly inaccurate power monitoring. However, there is no problem with using this power monitoring circuit when monitoring a modulated signal in OFDM (Orthogonal Frequency Division Multiplexing), which has been used in wireless LAN systems and WiMAX systems in recent years. The reason for this is as follows. The average operating output power of OFDM power amplifiers is approximately 8-10 dB lower than their saturated output power; that is, they operate in a perfectly linear range. Therefore, the output power of the transistor $Tr_{13}$ in FIG. 24 depends only on its input power and gain, which is linear. Further, since the base-collector junction of the transistor $Tr_{13}$ provides isolation and the wave detector circuit is connected to the input side (i.e., the base) of the transistor $Tr_{13}$, the wave detector circuit can accurately monitor the power of the forward propagating wave without using a coupler even when a load change occurs.

FIGS. 26 and 27 are circuit diagrams of conventional RF wave detector circuits. In these figures, symbol $V_{in}$ denotes an RF input voltage; $V_{ref}$, a reference DC voltage; $V_{det}$, a detected voltage (or output voltage); $R_{in}$, $R_{ref1}$, $R_{ref2}$, $R_{a1}$, $R_{a2}$, and $R_{a3}$, resistors; $R_{out}$, a smoothing resistor; $Tr_1$ and $Tr_2$, HBTs; $C_{in}$, a DC blocking capacitance; $C_{out}$, a smoothing capacitance; and $OP_1$, an operational amplifier. The detected voltage (or output voltage) $V_{det}$ is usually proportional to the RF input voltage, and the input power $P_{in}$ is proportional to the square of the RF input voltage. As a result, the input power $P_{in}$ is proportional to the square of the detected voltage $V_{det}$, as shown in FIG. 28.

Since an HBT usually has very low input impedance, the voltage at its base has a much lower amplitude than the voltage at its collector. Therefore, if the simple diode detector circuit shown in FIG. 26 is connected to the base of the final stage transistor $Tr_{13}$ in the power amplifier shown in FIG. 24, the detector circuit may not able to detect the RF signal since the amplitude of the voltage at the base of the transistor $Tr_{13}$ is very low. The differential diode detector circuit shown in FIG. 27, on the other hand, can detect small variations in voltage. Further, the detector circuit shown in FIG. 27 exhibits reduced variation in detected voltage with temperature, as compared to the detector circuit shown in FIG. 26.

However, while all components of the detector circuit shown in FIG. 26 can be manufactured by a GaAs-HBT process, the operational amplifier $OP_1$ of the detector circuit shown in FIG. 27 cannot be formed by a GaAs-HBT process. Therefore, in the case of the detector circuit shown in FIG. 27, an Si circuit (namely, the operational amplifier $OP_1$) must be mounted on the board or the module substrate. That is, the detector circuit shown in FIG. 27 is disadvantageous in that it cannot be integrally formed with the power amplifier on the GaAs-HBT substrate.

SUMMARY OF THE INVENTION

The present invention has been devised to solve the above problems. It is, therefore, an object of the present invention to provide a wave detector circuit that can be integrated on the same substrate as a GaAs-HBT power amplifier and that can detect an RF power signal having a low voltage amplitude and exhibit reduced variation in detected voltage with temperature.

A wave detector circuit of the present invention includes: a first transistor having its base and collector connected together, the first transistor receiving an AC signal and a reference voltage at its base and collector; a second transistor having its base connected to the base of the first transistor through a first resistor, the second transistor outputting a detected voltage at its collector; and a diode-connected temperature compensation transistor connected between ground potential and the base and hence the collector of the first transistor.

Thus, the present invention can provide a wave detector circuit that can be integrated on the same substrate as a GaAs-HBT power amplifier and that can detect an RF power signal having a low voltage amplitude and exhibit reduced variation in detected voltage with temperature.

Other and further objects, features and advantages of the invention will appear more fully from the following description.

DETAILED DESCRIPTION OF THE PREFERRED EMBODIMENTS

First Embodiment

Figure 1:
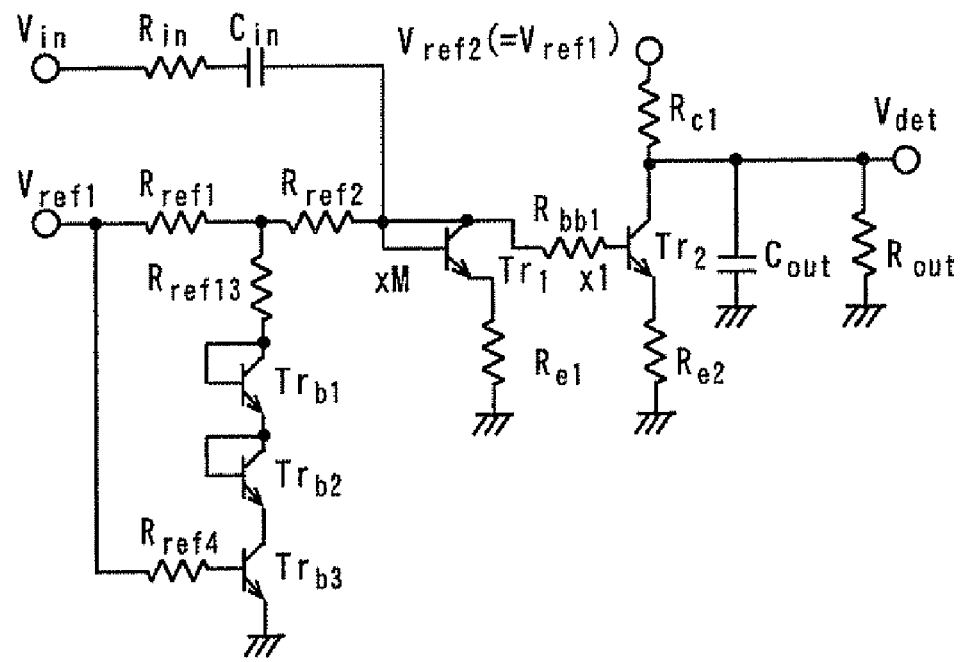
FIG. 1 is a circuit diagram of a wave detector circuit according to a first embodiment of the present invention.

FIG. 1 is a circuit diagram of a wave detector circuit according to a first embodiment of the present invention.

Referring to FIG. 1, a transistor (or first transistor) $Tr_1$ has its base and collector connected together. An RF input voltage (or AC signal) $V_{in}$ is input to the base and hence the collector of the transistor $Tr_1$ through a resistor $R_{in}$, and a DC blocking capacitance $C_{in}$. Further, a reference voltage $V_{ref1}$ is also input to the base and hence the collector of the transistor $Tr_1$ through resistors $R_{ref1}$ and $R_{ref2}$. The emitter of the transistor $Tr_1$ is grounded through an emitter resistor $R_{e1}$.

A transistor (or second transistor) $Tr_2$ has its base connected to the base of the transistor $Tr_1$ through a resistor (or first resistor) $R_{bb1}$. A reference voltage $V_{ref2}$ is input to the collector of the transistor $Tr_2$ through a resistor $R_{c1}$. The emitter of the transistor $Tr_2$ is grounded through an emitter resistor $R_{ee}$. The transistor $Tr_2$ outputs a detected voltage $V_{det}$ at its collector. A smoothing capacitance $C_{out}$ and a smoothing resistor $R_{out}$ are connected in parallel between ground potential and the junction between the collector of the transistor $Tr_2$ and the output terminal for the detected voltage $V_{det}$.

A resistor $R_{ref3}$ and transistors (or temperature compensation transistors) $Tr_{b1}$, $Tr_{b2}$, and $Tr_{b3}$ are connected in series between ground potential and the junction between the resistors $R_{ref1}$ and $R_{ref2}$. The base and collector of each transistor $Tr_{b1}$, $Tr_{b2}$ are connected together, and the base of the transistor $Tr_{b3}$ is connected to the input terminal for the reference voltage $V_{ref1}$ through a resistor $R_{ref4}$. That is, the transistors $Tr_{b1}$, $Tr_{b2}$, and $Tr_{b3}$ are in diode connection. These transistors $Tr_{b1}$, $Tr_{b2}$, and $Tr_{b3}$ and resistors $R_{ref3}$ and $R_{ref4}$ form a temperature compensation circuit. It should be noted that the transistors $Tr_1$ and $Tr_2$ and $Tr_{b1}$ to $Tr_{b3}$ are heterojunction bipolar transistors (HBTs).

The basic operation of this wave detector circuit is as follows. The amplification rate between the transistors $Tr_1$ and $Tr_2$ is M:1 (M>1). That is, the transistor $Tr_1$ allows more current to flow than the transistor $Tr_2$. Therefore, the (collector) current of the transistor $Tr_2$ is 1/M times the reference DC current supplied from the reference DC voltage $V_{ref1}$ source to the transistor $Tr_1$. It should be noted that each transistor is biased such that the output voltage $V_{det}$ is at its minimum when the RF input voltage $V_{in}$ is not supplied.

Figure 2:
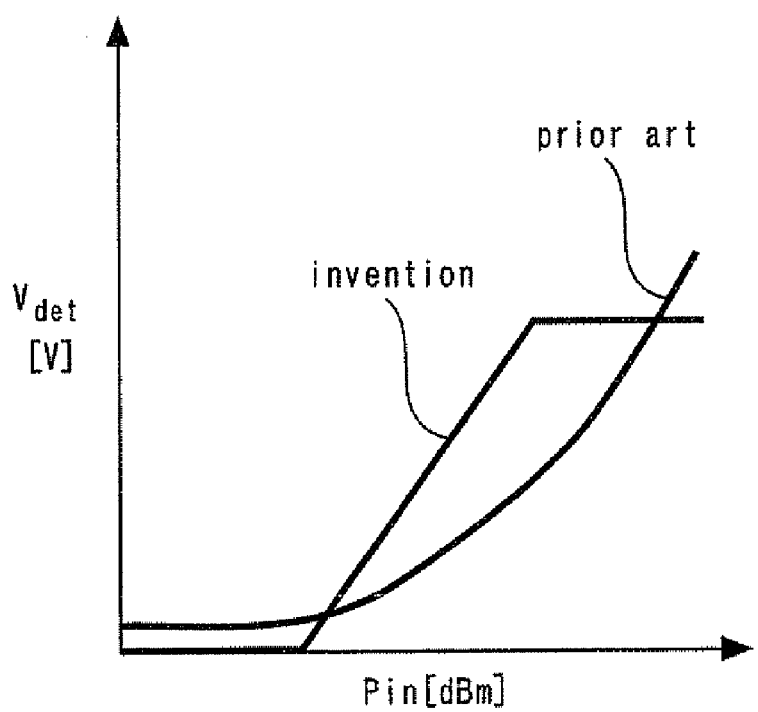
FIG. 2 is a diagram showing the input power vs. detected voltage characteristic of the circuit shown in FIG. 1.

As the RF input power input to the transistor $Tr_1$ increases, the base-emitter DC voltage of the transistor $Tr_1$ decreases and so does the mirror current flowing through the transistor $Tr_2$. As a result, the detected voltage, or output voltage, $V_{det}$ increases since the voltage drop across the resistor $R_{c1}$ decreases. The resistor $R_{bb1}$ is set to an appropriately high value such that the input power $P_{in}$ vs. detected voltage $V_{det}$ characteristic (or $V_{det}$-$P_{in}$ characteristic) curve has a relatively gentle slope, as shown in FIG. 2. Since there is an exponential relationship between the collector current and the base-emitter voltage of a bipolar transistor, it is easy to adjust the $V_{det}$-$P_{in}$ characteristic to be dB-linear.

It should be noted that without the above temperature compensation circuit, as temperature increases, the base-emitter voltages of the transistors $Tr_1$ and $Tr_2$ decrease and hence the reference current in the transistor $Tr_1$ increases, resulting in an increase in the mirror current flowing through the transistor $Tr_2$ and hence a reduction in the detected voltage $V_{det}$. With the temperature compensation circuit, on the other hand, as temperature increases, the current flowing through the transistors $Tr_{b1}$, $Tr_{b2}$, and $Tr_{b3}$ increases, which allows the current in the transistor $Tr_1$ to be maintained substantially constant. As a result, it is possible to maintain the detected voltage $V_{det}$ (that is, the collector voltage of the transistor $Tr_2$) at a constant level.

Thus, the wave detector circuit of the present embodiment can detect an RF power signal having a low voltage amplitude by monitoring, or detecting, small variations in the base-emitter DC voltage of the HBT. Further, this wave detector circuit includes a temperature compensation circuit to reduce variations in the detected voltage due to temperature changes. Further, all components of the wave detector circuit can be formed by a GaAs-HBT process, which allows the detector circuit to be integrated on the same substrate as a GaAs-HBT power amplifier.

Second Embodiment

Figure 3:
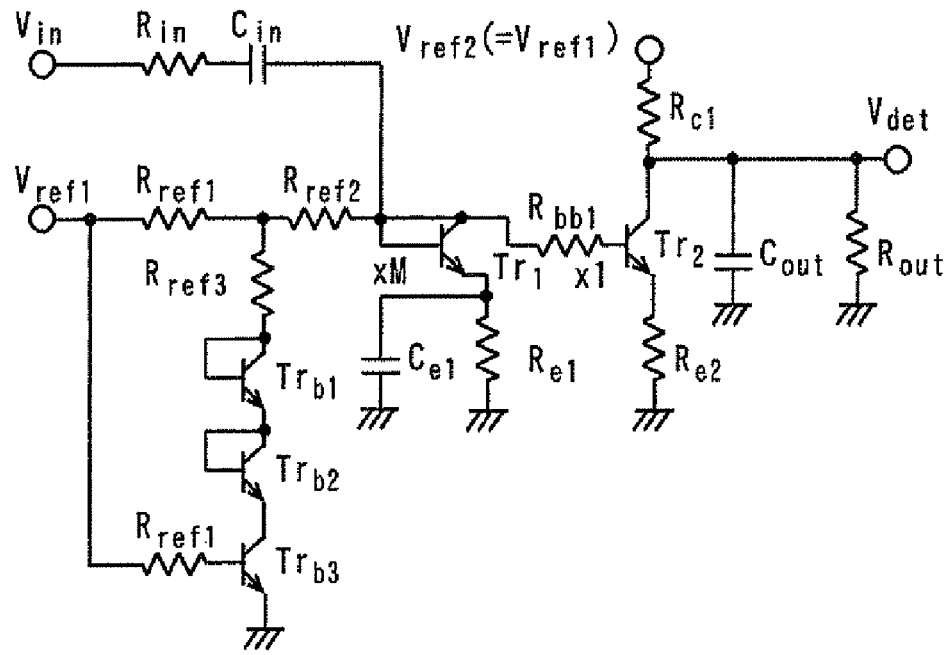
FIG. 3 is a circuit diagram of a wave detector circuit according to a second embodiment of the present invention.

FIG. 3 is a circuit diagram of a wave detector circuit according to a second embodiment of the present invention. The wave detector circuit of the present embodiment differs from that of the first embodiment in that it additionally includes a capacitance (or second capacitance) $C_{e1}$ connected in parallel with the resistor $R_{e1}$ between the emitter of the transistor $Tr_1$ and ground potential. All other components are similar to those described in connection with the first embodiment.

This capacitor $C_{e1}$ causes the RF input power to bypass the $R_{e1}$ (that is, the RF input power signal predominantly passes through the capacitor $C_{e1}$). This allows the wave detector circuit to detect lower input power, as compared to the first embodiment. That is, the $V_{det}$-$P_{in}$ characteristic curve shown in FIG. 2 has been translated to the left along the $P_{in}$ axis. It should be noted, however, that this does not mean increased dynamic input power $P_{in}$ range of the wave detector circuit. Therefore, the detector circuit saturates at lower input power $P_{in}$. It should be noted that the present embodiment also has the effects described in connection with the first embodiment.

Third Embodiment

Figure 4:
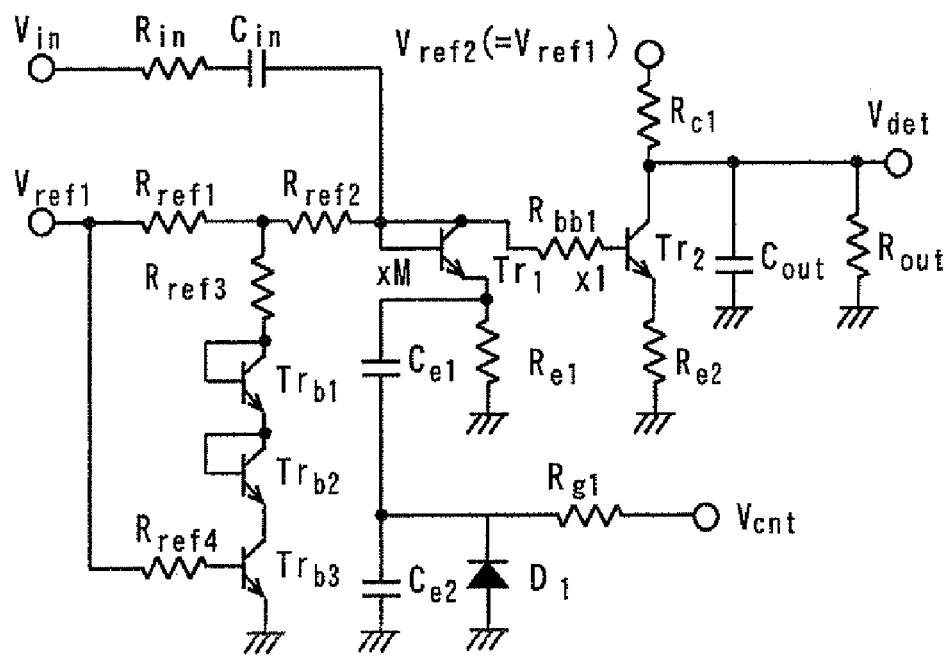
FIG. 4 is a circuit diagram of a wave detector circuit according to a third embodiment of the present invention.

FIG. 4 is a circuit diagram of a wave detector circuit according to a third embodiment of the present invention. The wave detector circuit of the present embodiment differs from that of the second embodiment in that it additionally includes a variable capacitance diode, etc. to provide a variable capacitance. Specifically, referring to FIG. 4, series-connected capacitances $C_{e1}$ and $C_{e2}$ are connected in parallel with a resistor $R_{e1}$ between the emitter of the transistor $Tr_1$ and ground potential. Further, a resistor $R_{g1}$ is connected between the input terminal for a control voltage $V_{cnt}$ and the junction between the capacitances $C_{e1}$ and $C_{e2}$. Further, a variable capacitance diode $D_1$ is connected at its cathode to the junction between the capacitances $C_{e1}$ and $C_{e2}$ and at its anode to ground potential. All other components are similar to those described in connection with the first embodiment.

The above arrangement allows one to translate the $V_{det}$-$P_{in}$ characteristic curve shown in FIG. 2 along the $P_{in}$ axis by changing the capacitance value of the variable capacitance diode $D_1$. In this way, it is possible to set an appropriate $V_{det}$-$P_{in}$ characteristic for the required input power range. It should be noted that the present embodiment also has the effects described in connection with the first embodiment.

Fourth Embodiment

Figure 5:
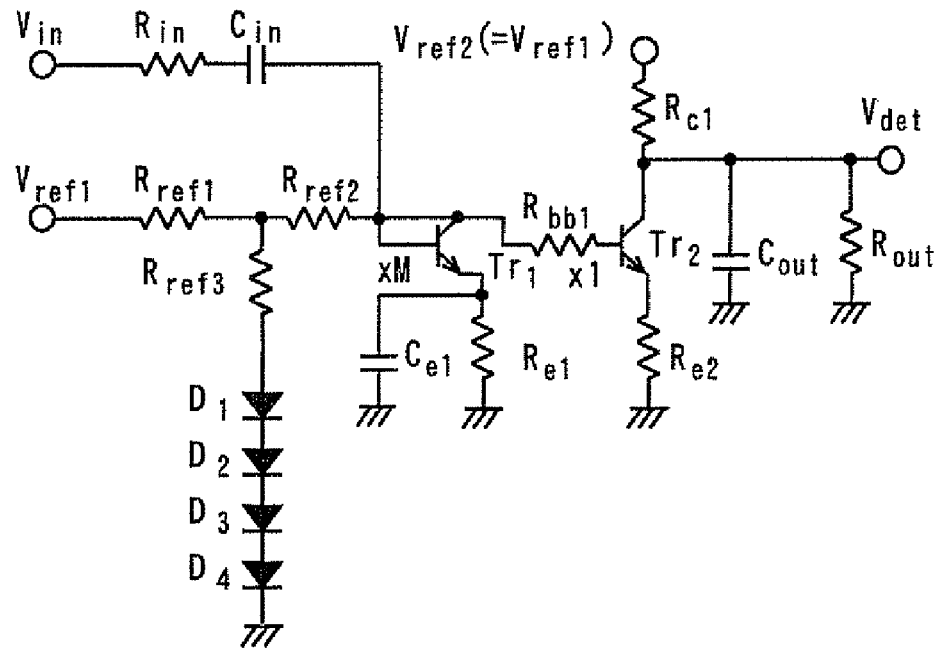
FIG. 5 is a circuit diagram of a wave detector circuit according to a fourth embodiment of the present invention.

FIG. 5 is a circuit diagram of a wave detector circuit according to a fourth embodiment of the present invention. The wave detector circuit of the fourth embodiment differs from that of the second embodiment in that it includes Schottky barrier diodes (or temperature compensation diodes) $D_1$ to $D_4$ instead of the transistors $Tr_{b1}$ to $Tr_{b3}$.

The Schottky barrier diodes $D_1$ to $D_4$ are usually formed in an HBT process by forming a metal in Schottky contact with a collector layer. The barrier potential of the Schottky barrier diodes $D_1$ to $D_4$ is low (approximately 0.7 V), as compared to that of the transistors $Tr_{b1}$ to $Tr_{b3}$ of the second embodiment (approximately 1.25 V). Therefore, the present embodiment allows one to apply various amounts of temperature compensation, resulting in increased degree of freedom in designing the temperature compensation circuit. It should be noted that the resultant $V_{det}$-$P_{in}$ characteristic is similar to that of the second embodiment. Further, the present embodiment also has the effects described in connection with the second embodiment.

Fifth Embodiment

Figure 6:
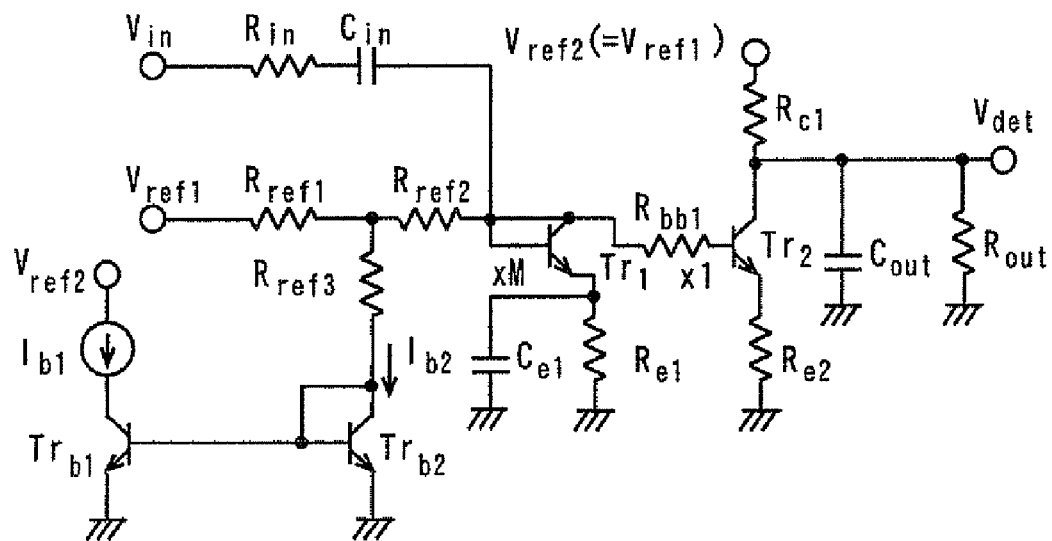
FIG. 6 is a circuit diagram of a wave detector circuit according to a fifth embodiment of the present invention.

FIG. 6 is a circuit diagram of a wave detector circuit according to a fifth embodiment of the present invention. The wave detector circuit of the fifth embodiment differs from that of the second embodiment in that its temperature compensation circuit includes a current mirror and a constant current source $I_{b1}$ having a positive temperature coefficient, instead of the transistors $Tr_{b1}$ to $Tr_{b3}$. The current mirror is made up of a transistor (or first temperature compensation transistor) $Tr_{b1}$ and a transistor (or second temperature compensation transistor) $Tr_{b2}$. All other components of this wave detector circuit are similar to those described in connection with the second embodiment.

Referring to FIG. 6, the transistor $Tr_{b2}$ is connected between the resistor $R_{ref3}$ and ground potential, that is, between the base (and hence the collector) of the transistor $Tr_1$ and ground potential. The base and the collector of the transistor $Tr_{b2}$ are connected together to the base of the transistor $Tr_{b1}$. The constant current source $I_{b1}$ supplies a current to the base and collector of the transistor $Tr_{b1}$.

The constant current source $I_{b1}$ having a positive temperature coefficient may be made up of a band gap reference (BGR) voltage source (which is often used in Si circuits) and an emitter follower. It should be noted that the BGR voltage source must have a voltage of approximately 4 Vbe or higher. The BGR voltage source can be designed so as to easily adjust the temperature characteristics of the constant current source $I_{b1}$ and thereby allow for finer adjustment of the temperature coefficient of the temperature compensation circuit, as compared to the second and fourth embodiments. It should be noted that the resultant $V_{det}$-$P_{in}$ characteristic is similar to that of the second embodiment. Further, the present embodiment also has the effects described in connection with the second embodiment.

Sixth Embodiment

Figure 7:
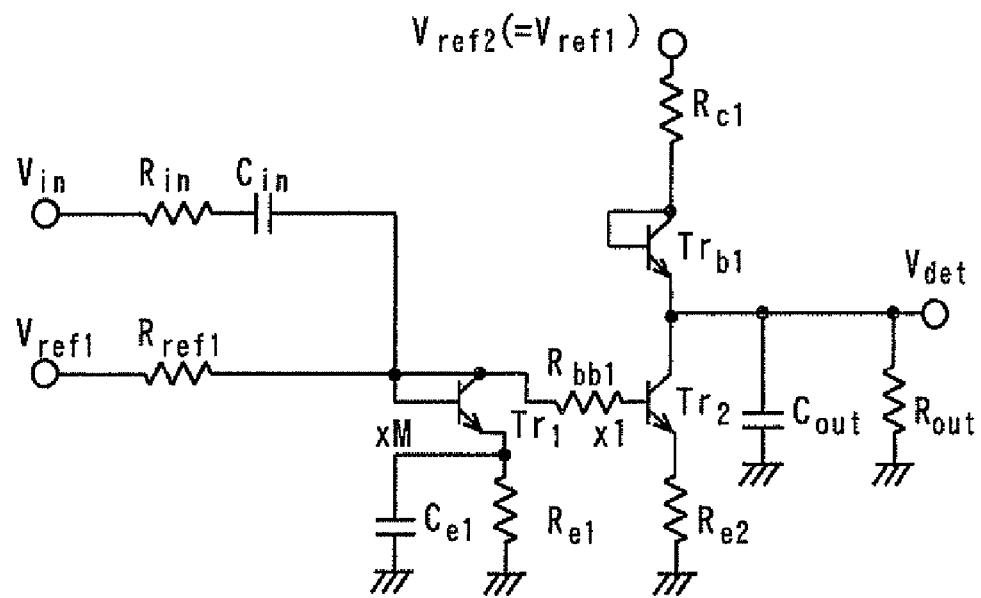
FIG. 7 is a circuit diagram of a wave detector circuit according to a sixth embodiment of the present invention.

FIG. 7 is a circuit diagram of a wave detector circuit according to a sixth embodiment of the present invention. The wave detector circuit of the sixth embodiment differs from that of the second embodiment in that, instead of the temperature compensation circuit made up of the transistors $Tr_{b1}$ to $Tr_{b3}$, it includes a transistor (or temperature compensation transistor) $Tr_{b1}$ connected to the collector (or output side) of the transistor $Tr_2$. All other components are similar to those described in connection with the second embodiment.

The transistor Trb1 is connected between the input terminal for the reference $V_{ref2}$ and the collector of the transistor $Tr_2$. The base and collector of the transistor $Tr_{b1}$ are connected together. That is, the transistor $Tr_{b1}$ is in diode connection.

As temperature increases, the base-emitter voltages of the transistors $Tr_1$ and $Tr_2$ decrease and hence the reference current in the transistor $Tr_1$ and the collector current of the transistor $Tr_2$ increase, resulting in an increase in the voltage drop across the resistor $R_{c1}$. Without the transistor $Tr_{b1}$, this would result in a reduction in the detected voltage $V_{det}$. With the transistor $Tr_{b1}$, however, the reduction of the detected voltage $V_{det}$ is limited, since the base-emitter voltage of the transistor $Tr_{b1}$ also decreases. That is, the transistor $Tr_{b1}$ has a temperature compensation function. It should be noted that the resultant $V_{det}$-$P_{in}$ characteristic is similar to that of the second embodiment. Further, the present embodiment also has the effects described in connection with the second embodiment.

Seventh Embodiment

Figure 8:
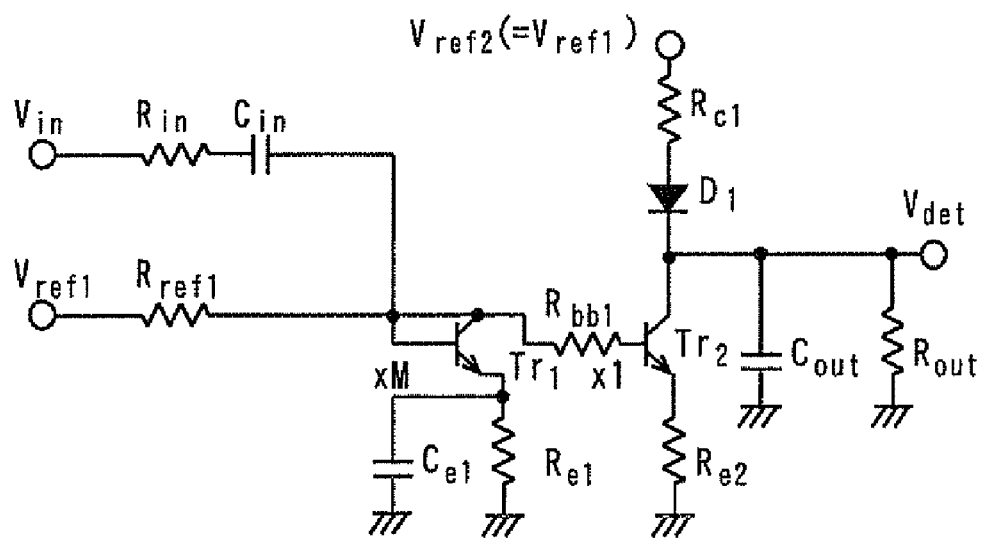
FIG. 8 is a circuit diagram of a wave detector circuit according to a seventh embodiment of the present invention.

FIG. 8 is a circuit diagram of a wave detector circuit according to a seventh embodiment of the present invention. The wave detector circuit of the seventh embodiment differs from that of the sixth embodiment in that its temperature compensation circuit includes a Schottky barrier diode (or temperature compensation diode) $D_1$ instead of the transistor $Tr_{b1}$. The use of the Schottky barrier diode increases the degree of freedom in designing the temperature compensation circuit. It should be noted that the resultant $V_{det}$-$P_{in}$ characteristic is similar to that of the second embodiment. Further, the present embodiment also has the effects described in connection with the second embodiment.

Eighth Embodiment

Figure 9:
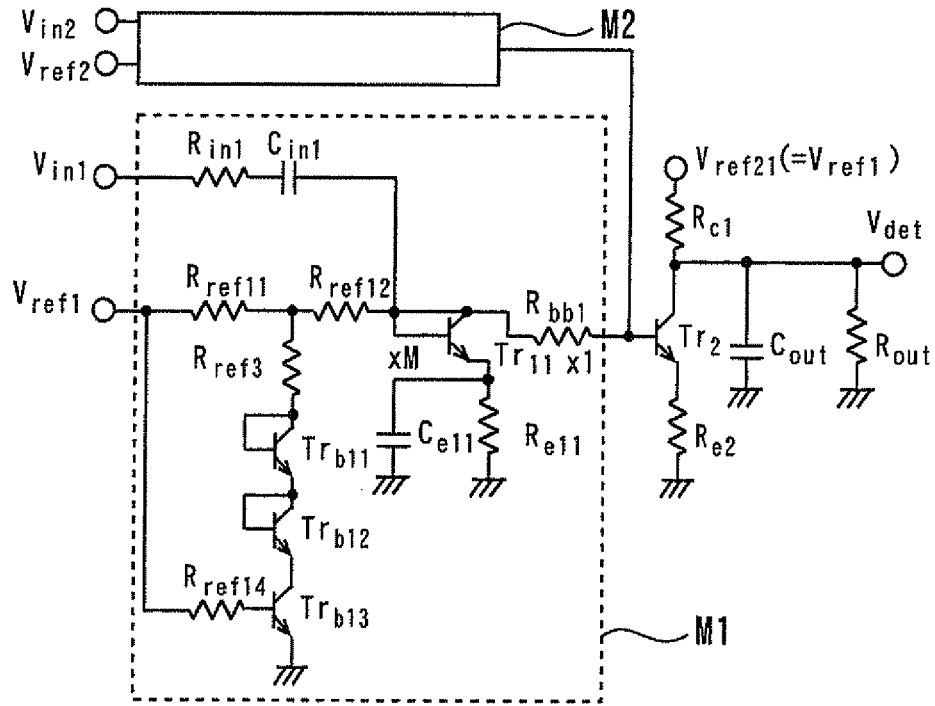
FIG. 9 is a circuit diagram of a wave detector circuit according to an eighth embodiment of the present invention.

FIG. 9 is a circuit diagram of a wave detector circuit according to an eighth embodiment of the present invention. It should be noted that the wave detector circuits of the first and second embodiments can be divided into two blocks: a detector block including the transistor $Tr_1$; and a voltage-to-current conversion block including the transistor $Tr_2$. The wave detector circuit of the present embodiment includes a single common voltage-to-current conversion block and a plurality of detector blocks (namely, two detector blocks M1 and M2). The detector block M1 (and the detector block M2) includes a transistor $Tr_1$, a resistor $R_{bb1}$, and transistors $Tr_{b1}$, $Tr_{b2}$, and $Tr_{b3}$, as in the detector blocks of the first and second embodiments. All other components are similar to those described in connection with the second embodiment.

This wave detector circuit is suitable for multiband power amplifiers, which are expected to become widely used in the future. A multiband power amplifier includes as many output units (at the final stage) as there are target bands. Therefore, the wave detector circuit may be configured to include as many detector blocks as there are output units in the multiband power amplifier. With this, the wave detector circuit can be adapted to match the multiband power amplifier by using only a single common voltage-to-current conversion block. As a result, the wave detector circuit of the present embodiment requires only a reduced space, as compared to conventional wave detector circuits for multiband power amplifiers. It should be noted that the present embodiment also has the effects described in connection with the second embodiment.

Ninth Embodiment

Figure 10:
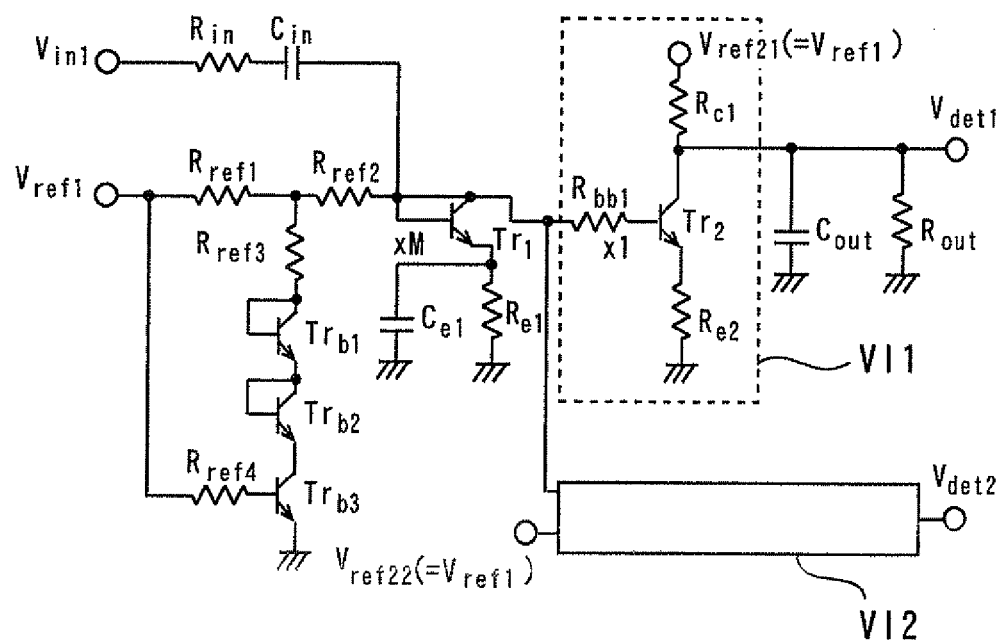
FIG. 10 is a circuit diagram of a wave detector circuit according to a ninth embodiment of the present invention.

FIG. 10 is a circuit diagram of a wave detector circuit according to a ninth embodiment of the present invention. The wave detector circuit of the present embodiment includes a single common detector block and a plurality of voltage-to-current conversion blocks (namely, two voltage-to-current conversion blocks VI1 and VI2). The voltage-to-current conversion block VI1 (and the voltage-to-current conversion block VI2) includes a transistor $Tr_2$ and a resistor $R_{bb1}$, as in the voltage-to-current conversion blocks of the first and second embodiments. All other components are similar to those described in connection with the second embodiment.

The resistors $R_{bb1}$ in the voltage-to-current conversion blocks VI1 and VI2 may be set to have different values to generate different detected voltages (or output voltages) for the same input power. With this arrangement, products having different specifications or uses can receive different detected voltages from the same wave detector circuit. It should be noted that the present embodiment also has the effects described in connection with the second embodiment.

Tenth Embodiment

Figure 11:
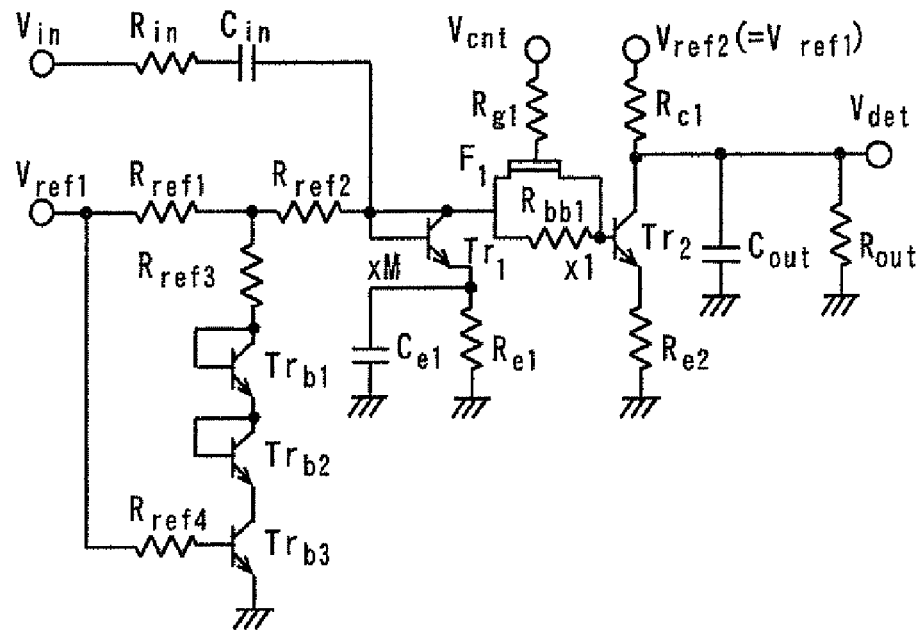
FIG. 11 is a circuit diagram of a wave detector circuit according to a tenth embodiment of the present invention.
Figure 12:
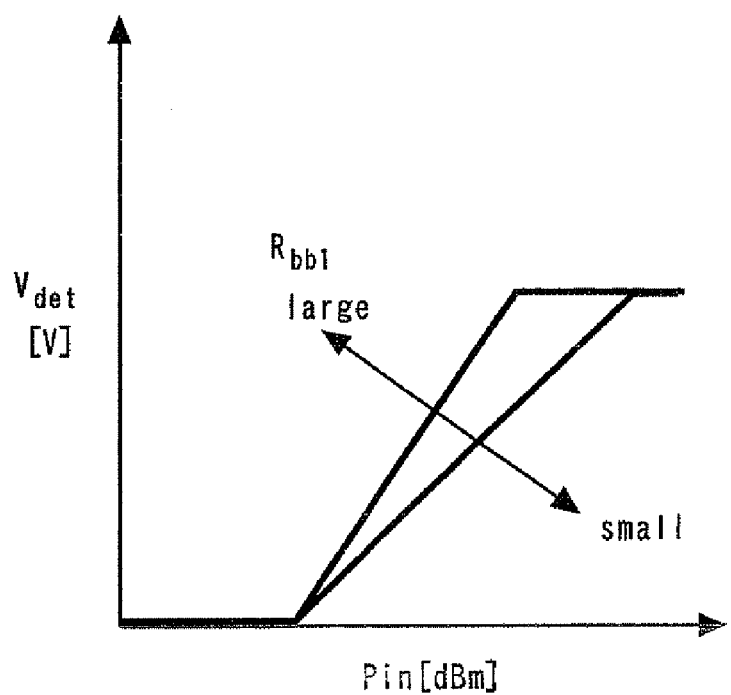
FIG. 12 is a diagram showing the input power vs. detected voltage characteristic of the circuit shown in FIG. 11.

FIG. 11 is a circuit diagram of a wave detector circuit according to a tenth embodiment of the present invention. The wave detector circuit of the tenth embodiment differs from that of the second embodiment in that it additionally includes a field-effect transistor $F_1$ connected in parallel to the resistor $R_{bb1}$ to form a variable resistor. More specifically, a control voltage $V_{cnt}$ is input to the gate of the field-effect transistor $F_1$ through a resistor $R_{g1}$. With this arrangement, the control voltage $V_{cnt}$ is changed to change the transfer characteristics of the transistors $Tr_1$ and $Tr_2$ and thereby adjust the slope of the $V_{det}$-$P_{in}$ characteristic curve, as shown in FIG. 12. It should be noted that the present embodiment also has the effects described in connection with the second embodiment.

Eleventh Embodiment

Figure 13:
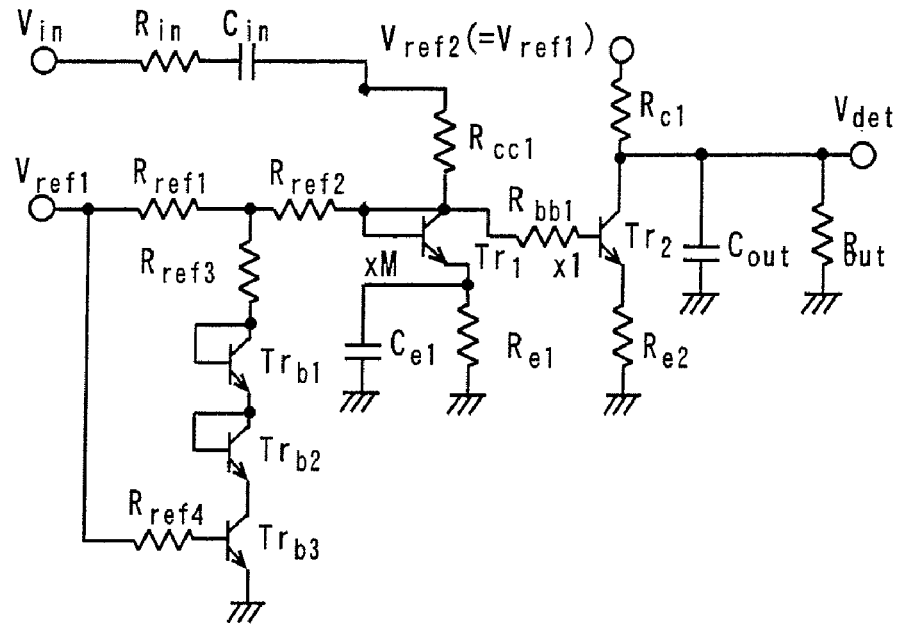
FIG. 13 is a circuit diagram of a wave detector circuit according to an eleventh embodiment of the present invention.
Figure 15:
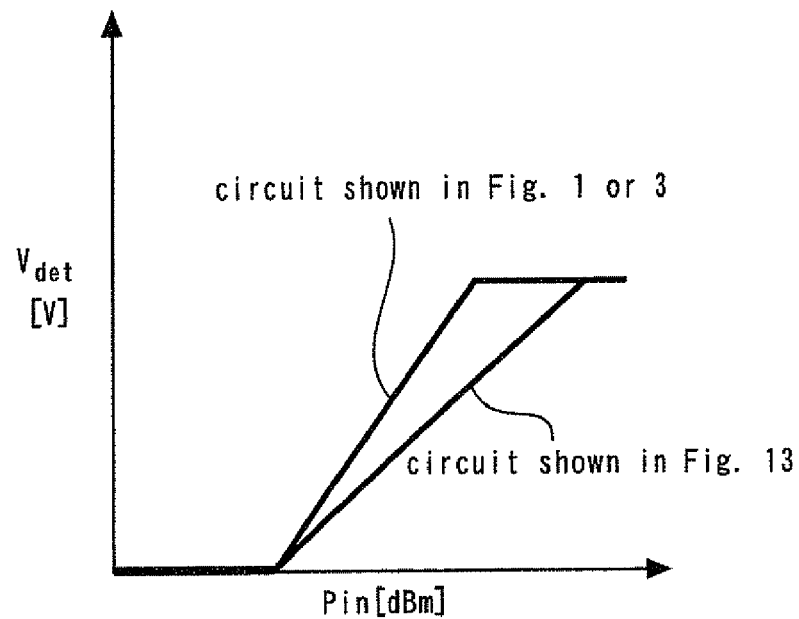
FIG. 15 is a diagram showing the input power vs. detected voltage characteristic of the circuit shown in FIG. 14.

FIG. 13 is a circuit diagram of a wave detector circuit according to an eleventh embodiment of the present invention. The wave detector circuit of the present embodiment differs from that of the second embodiment in that it additionally includes a resistor $R_{cc1}$ connected between the base and collector of the transistor $Tr_1$. The value of this resistor $R_{cc1}$ may be changed to adjust the slope of the $V_{det}$-$P_{in}$ characteristic curve, as shown in FIG. 15. It should be noted that the present embodiment also has the effects described in connection with the second embodiment.

Twelfth Embodiment

According to a twelfth embodiment of the present invention, the resistor $R_{bb1}$ in the wave detector circuits of the first to eleventh embodiments is implemented by a transistor base layer. Since the resistor $R_{bb1}$ connected between the transistors $Tr_1$ and $Tr_2$ is relatively high, the DC current gain β of the transistors affects the $V_{det}$-$P_{in}$ characteristic. Therefore, when the DC current gain β of the transistors is high (that is, the base layer is thin), the resistor $R_{bb1}$ is high. On the other hand, when the DC current gain β of the transistors is low, the resistor $R_{bb1}$ is low. Thus, the present embodiment allows for adjustment of the slope of the $V_{det}$-$P_{in}$ characteristic curve. It should be noted that the present embodiment may also have the effects described in connection with the first to eleventh embodiments.

Thirteenth Embodiment

Figure 14:
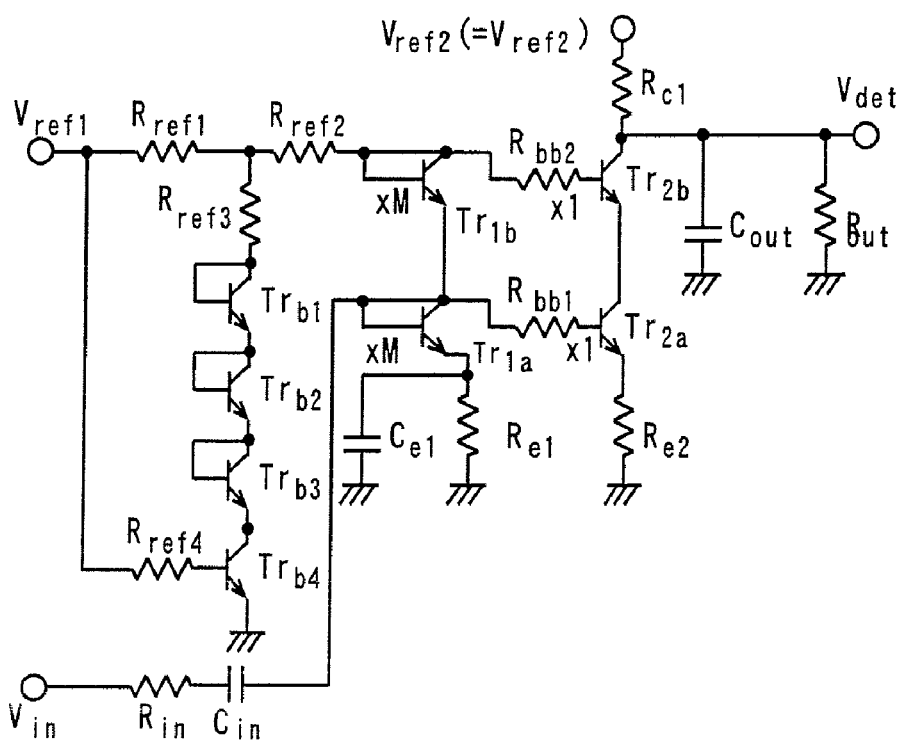
FIG. 14 is a circuit diagram of a wave detector circuit according to a thirteenth embodiment of the present invention.

FIG. 14 is a circuit diagram of a wave detector circuit according to a thirteenth embodiment of the present invention. The wave detector circuit of the present embodiment differs from that of the second embodiment in that the current mirror of the second embodiment has been replaced by a cascode mirror.

Referring to FIG. 14, a transistor (or first transistor) $Tr_{1a}$ has its base and collector connected together. An RF input voltage (or AC signal) $V_{in}$ is input to the base (and hence collector) of the transistor $Tr_{1a}$ through a resistor $R_{in}$ and a DC blocking capacitance $C_{in1}$. The emitter of the transistor $Tr_{1a}$ is grounded through a resistor $R_{e1}$. A capacitance (or second capacitance) $C_{e1}$ is connected in parallel to the resistor $R_{e1}$ between the emitter of the transistor $Tr_{1a}$ and ground potential.

The base of a transistor (or second transistor) $Tr_{2a}$ is connected to the base of the transistor $Tr_{1a}$ through a resistor (or first resistor) $R_{bb1}$. The emitter of the transistor $Tr_{2a}$ is grounded through a resistor $R_{e2}$.

The emitter of a transistor (or third transistor) $Tr_{1b}$ is connected to the collector of the transistor $Tr_{1a}$. The base and collector of the transistor $Tr_{1b}$ are connected together. A reference voltage $V_{ref1}$ is input to the base and collector of the transistor $Tr_{1b}$ through resistors $R_{ref1}$ and $R_{ref2}$.

The base of a transistor (or fourth transistor) $Tr_{2b}$ is connected to the base of the transistor $Tr_{1b}$ through a resistor (or second resistor) $R_{bb2}$. A reference voltage $V_{ref2}$ is input to the collector of the transistor $Tr_{2b}$ through a resistor $R_{c1}$. The transistor $Tr_{2b}$ outputs a detected voltage $V_{det}$ at its collector. A smoothing capacitance $C_{out}$ and a smoothing resistor $R_{out}$ are connected in parallel between ground potential and the junction between the collector of the transistor $Tr_{b2}$ and the output terminal for the detected voltage $V_{det}$.

A resistor $R_{ref3}$ and transistors (or temperature compensation transistors) $Tr_{b1}$, $Tr_{b2}$, $Tr_{b3}$, and $Tr_{b4}$ are connected in series between ground potential and the junction between the resistors $R_{ref1}$ and $R_{ref2}$. The base and collector of each transistor $Tr_{b1}$, $Tr_{b2}$, $Tr_{b3}$ are connected together, and the base of the transistor $Tr_{b4}$ is connected to the input terminal for the reference voltage $V_{ref1}$ through a resistor $R_{ref4}$. That is, these transistors $Tr_{b1}$, $Tr_{b2}$, $Tr_{b3}$, and $Tr_{b4}$ are in diode connection. The transistors $Tr_{b1}$, $Tr_{b2}$, and $Tr_{b3}$ (and $Tr_{b4}$) and the resistors $R_{ref3}$ and $R_{ref4}$ form a temperature compensation circuit. It should be noted that the transistors $Tr_{1a}$, $Tr_{1b}$, $Tr_{2a}$, and $Tr_{2b}$ and $Tr_{b1}$ to $Tr_{b4}$ are heterojunction bipolar transistors (HBTs). The amplification rate between the transistor $Tr_{1a}$ or $Tr_{1b}$ and the transistor $Tr_{2a}$ or $Tr_{2b}$ is M:1 (M>1). That is, the transistors $Tr_{1a}$ and $Tr_{1b}$ allow more current to flow than the transistors $Tr_{2a}$ and $Tr_{2b}$.

With this cascode arrangement, the value of the resistors $R_{bb1}$ and $R_{bb2}$ may be adjusted so as to provide a $V_{det}$-$P_{in}$ characteristic curve having a gentle slope, as shown in FIG. 15. The cascode arrangement requires that the reference voltages $V_{ref1}$ and $V_{ref2}$ be 1 Vbe (or approximately 1.3 V) higher than those in the second embodiment. It should be noted that the present embodiment also has the effects described in connection with the second embodiment.

Fourteenth Embodiment

Figure 16:
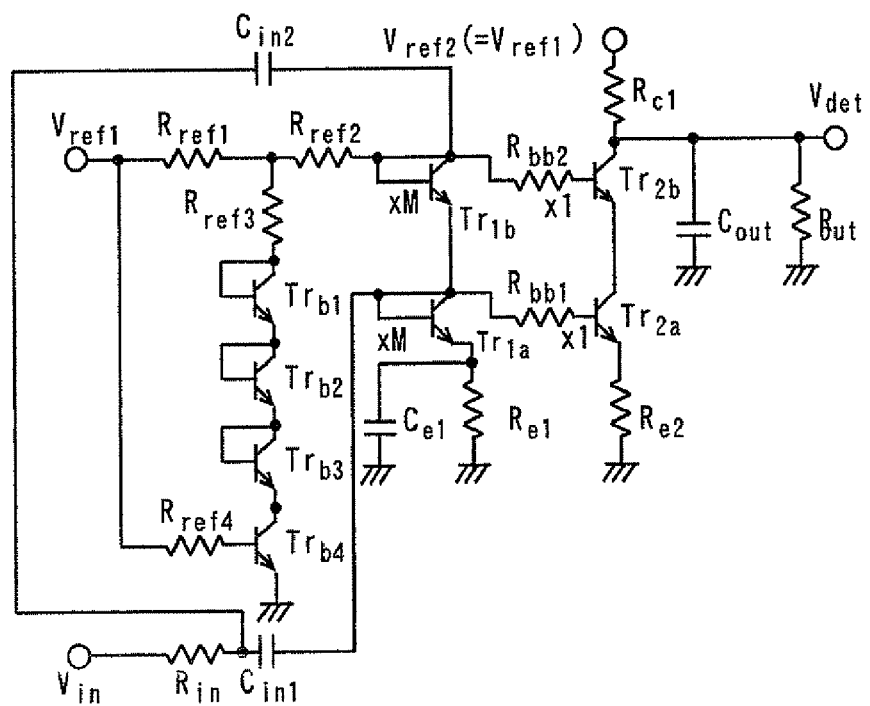
FIG. 16 is a circuit diagram of a wave detector circuit according to a fourteenth embodiment of the present invention.

FIG. 16 is a circuit diagram of a wave detector circuit according to a fourteenth embodiment of the present invention. The wave detector circuit of the present embodiment differs from that of the thirteenth embodiment in that it additionally includes a capacitance (or first capacitance) $C_{in2}$ connected between the input terminal for the RF input voltage $V_{in}$ and the base and hence collector of the transistor $Tr_{1b}$.

Thus, the RF input voltage $V_{in}$ is input to the transistors $Tr_{1a}$ and $Tr_{1b}$ through the capacitance $C_{in1}$ and $C_{in2}$, respectively, to provide a $V_{det}$-$P_{in}$ characteristic curve having a gentler slope than the $V_{det}$-$P_{in}$ characteristic curve of the thirteenth embodiment. It should be noted that the present embodiment also has the effects described in connection with the thirteenth embodiment.

Fifteenth Embodiment

Figure 17:
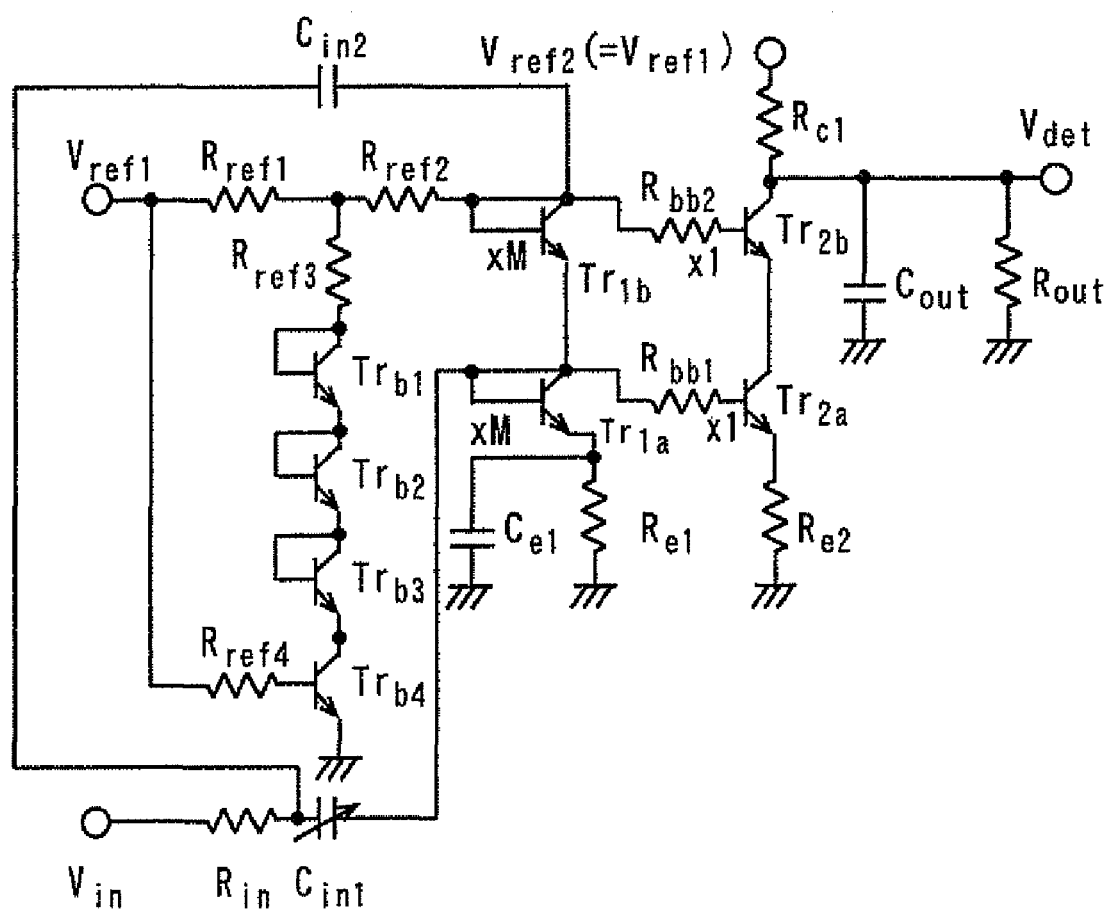
FIG. 17 is a circuit diagram of a wave detector circuit according to a fifteenth embodiment of the present invention.

FIG. 17 is a circuit diagram of a wave detector circuit according to a fifteenth embodiment of the present invention. The wave detector circuit of the present embodiment differs from that of the fourteenth embodiment in that the capacitance $C_{in1}$ (connected between the input terminal for the RF input voltage $V_{in}$, and the base and hence collector of the transistor $Tr_{1a}$) is a variable capacitance, not a fixed capacitance. With this arrangement, the value of the capacitance $C_{in1}$ may be changed to adjust the slope of the $V_{det}$-$P_{in}$ characteristic curve. It should be noted that the present embodiment also has the effects described in connection with the fourteenth embodiment.

Sixteenth Embodiment

Figure 18:
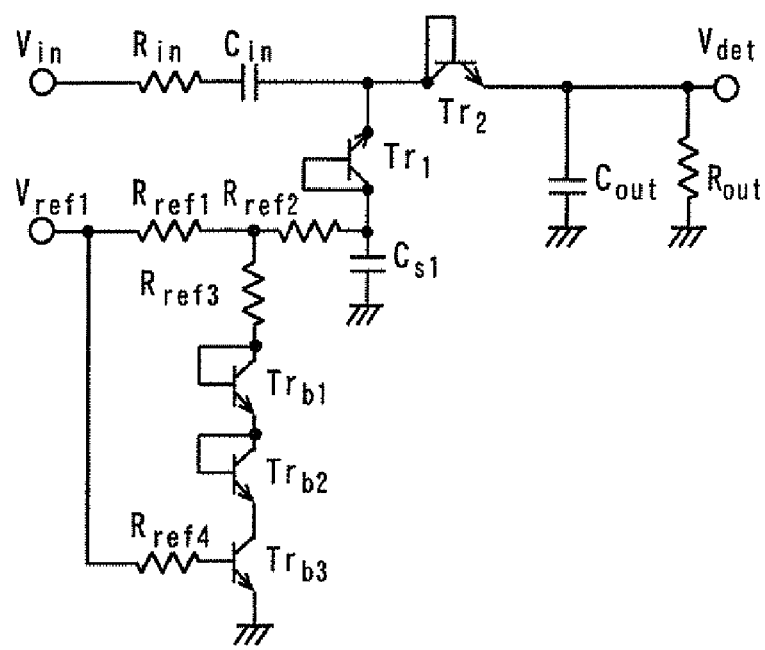
FIG. 18 is a circuit diagram of a wave detector circuit according to a sixteenth embodiment of the present invention.

FIG. 18 is a circuit diagram of a wave detector circuit according to a sixteenth embodiment of the present invention. This wave detector circuit is a voltage-doubler-based detector circuit having a temperature compensation function.

Referring to FIG. 18, a transistor (or first transistor) $Tr_1$ has its base and collector connected together. A reference voltage $V_{ref1}$ is input to the base and hence collector of the transistor $Tr_1$ through resistors $R_{ref1}$ and $R_{ref2}$. The base and collector of the transistor $Tr_1$ are grounded through a capacitance $C_{s1}$. This capacitance $C_{s1}$ DC-isolates the base and collector of the transistor $Tr_1$ from ground to allow an appropriate bias current to be supplied from the reference voltage $V_{ref1}$ source to the transistors $Tr_1$ and $Tr_2$ at once.

Referring still to FIG. 18, the transistor (or second transistor) $Tr_2$ also has its base and collector connected together. The emitter of the transistor $Tr_1$ is connected to the base and hence collector of the transistor $Tr_2$. An RF input voltage (or AC signal) is input to the base and hence the collector of the transistor $Tr_2$ through a resistor $R_{in}$ and a DC blocking capacitance $C_{in}$. The transistor $Tr_2$ outputs a detected voltage $V_{det}$ at its collector. A smoothing capacitance $C_{out}$ and a smoothing resistor $R_{out}$ are connected in parallel between ground potential and the junction between the collector of the transistor $Tr_2$ and the output terminal for the detected voltage $V_{det}$.

A resistor $R_{ref3}$ and transistors (or temperature compensation transistors) $Tr_{b1}$, $Tr_{b2}$, and $Tr_{b3}$ are connected in series between ground potential and the junction between the resistors $R_{ref1}$ and $R_{ref2}$. The base and collector of each transistor $Tr_{b1}$, $Tr_{b2}$ are connected together, and the base of the transistor $Tr_{b3}$ is connected to the input terminal for the reference voltage $V_{ref1}$ through a resistor $R_{ref4}$. That is, these transistors $Tr_{b1}$, $Tr_{b2}$, and $Tr_{b3}$ are in diode connection. The transistors $Tr_{b1}$, $Tr_{b2}$, and $Tr_{b3}$ and the resistors $R_{ref3}$ and $R_{ref4}$ form a temperature compensation circuit. It should be noted that the transistors $Tr_1$ and $Tr_2$ and $Tr_{b1}$ to $Tr_{b3}$ are heterojunction bipolar transistors (HBTs).

Figure 19:
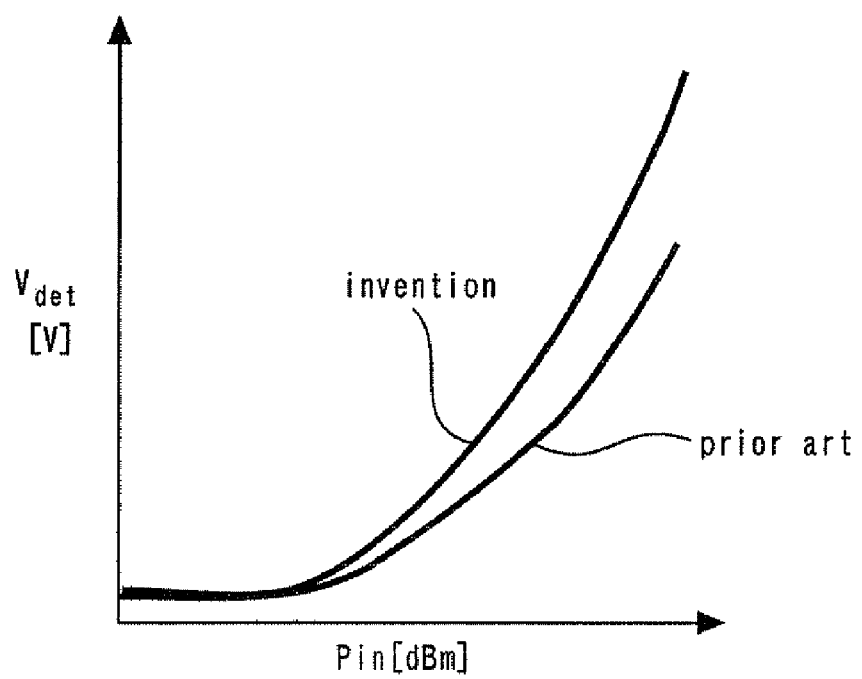
FIG. 19 is a diagram showing the input power vs. detected voltage characteristic of the circuit shown in FIG. 18.

FIG. 19 is a diagram showing the input power vs. detected voltage characteristic of the wave detector circuit shown in FIG. 18. Since this wave detector circuit is made up of a voltage doubler, it can produce a higher detected voltage than the wave detector circuit of the first embodiment. It should be noted that the present embodiment also has the effects described in connection with the first embodiment.

Seventeenth Embodiment

Figure 20:
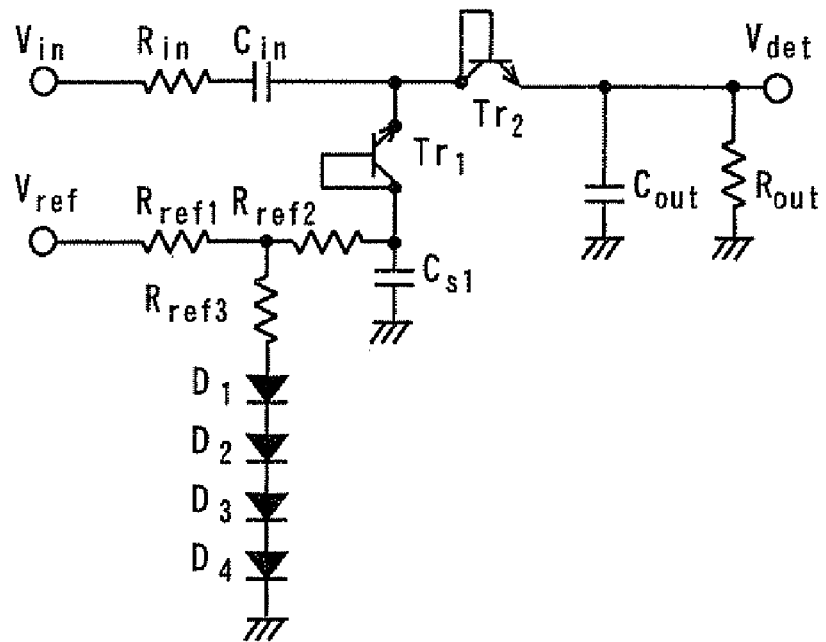
FIG. 20 is a circuit diagram of a wave detector circuit according to a seventeenth embodiment of the present invention.

FIG. 20 is a circuit diagram of a wave detector circuit according to a seventeenth embodiment of the present invention. The wave detector circuit of the present embodiment differs from that of the sixteenth embodiment in that its temperature compensation circuit includes Schottky barrier diodes (or temperature compensation diodes) $D_1$ to $D_4$ instead of the transistors $Tr_{b1}$ to $Tr_{b3}$. This allows one to apply various amounts of temperature compensation, resulting in increased degree of freedom in designing the temperature compensation circuit. It should be noted that the present embodiment also has the effects described in connection with the sixteenth embodiment.

Eighteenth Embodiment

Figure 21:
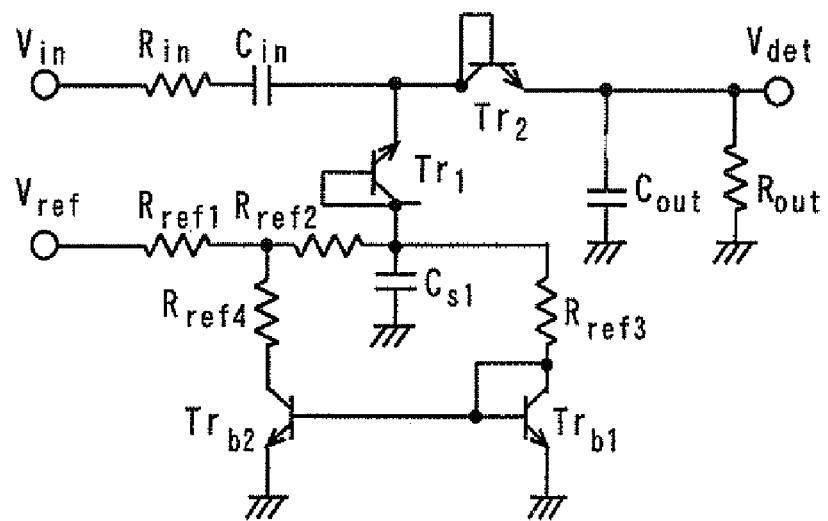
FIG. 21 is a circuit diagram of a wave detector circuit according to an eighteenth embodiment of the present invention.

FIG. 21 is a circuit diagram of a wave detector circuit according to an eighteenth embodiment of the present invention. The wave detector circuit of the eighteenth embodiment differs from that of the sixteenth embodiment in that its temperature compensation circuit includes a current mirror circuit instead of the transistors $Tr_{b1}$ to $Tr_{b3}$. The current mirror circuit is made up of transistors $Tr_{b1}$ and $Tr_{b2}$ and resistors $R_{ref3}$ and $R_{ref4}$. The resistor $R_{ref3}$ and the transistor $Tr_{b1}$ are connected in series between the base (and hence collector) of the transistor $Tr_1$ and ground potential. The transistor $Tr_{b1}$ is diode connected. Further, the resistor $R_{ref4}$ and the transistor $Tr_{b2}$ are connected in series between ground potential and the junction between the resistors $R_{ref1}$ and $R_{ref2}$. This arrangement allows the circuit size to be reduced by an amount equivalent to the size of a single transistor, as compared to the sixteenth embodiment. It should be noted that the present embodiment also has the effects described in connection with the sixteenth embodiment.

Nineteenth Embodiment

Figure 22:
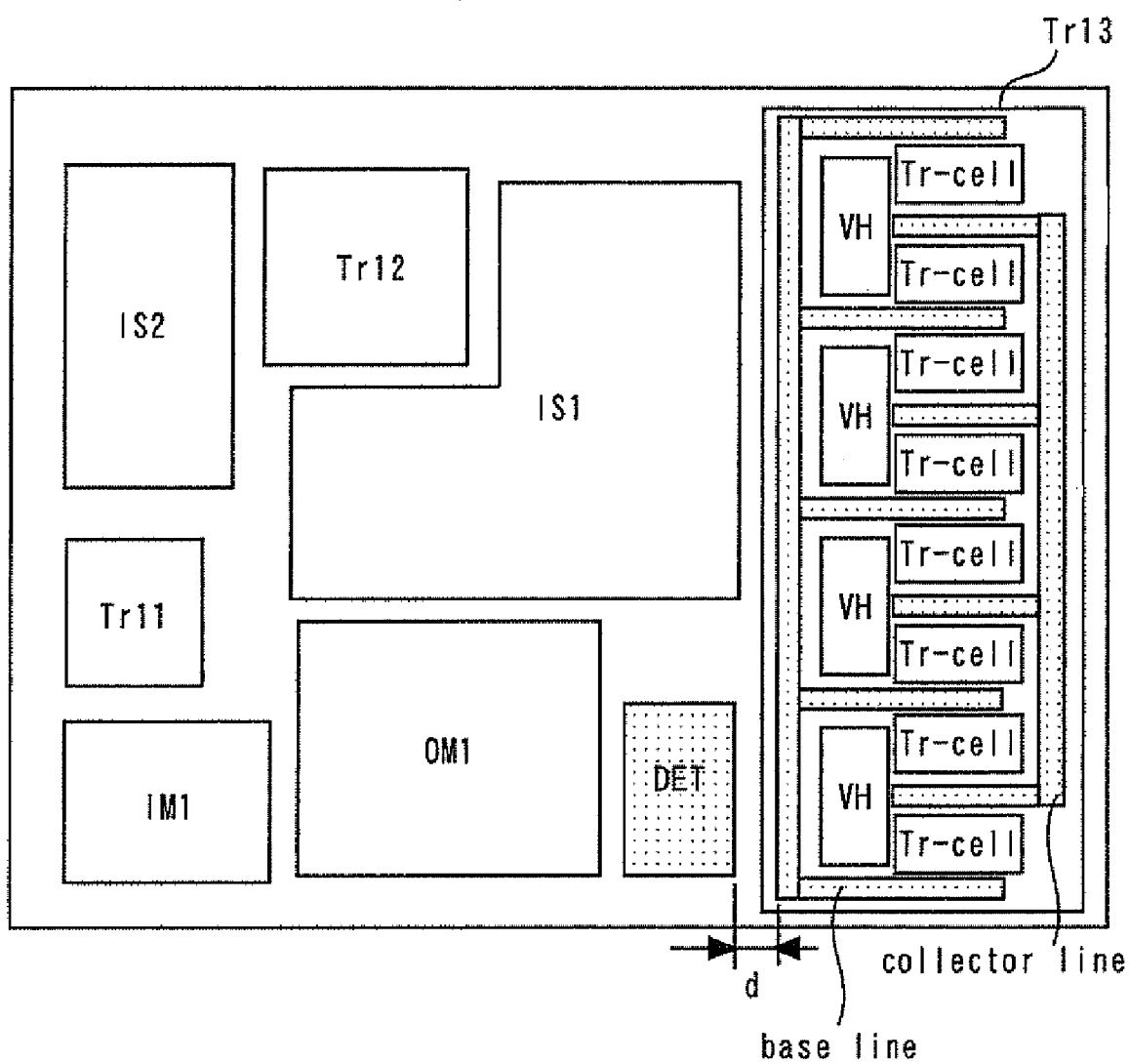
FIG. 22 is a top view showing an arrangement of a wave detector circuit and a three-stage power amplifier according to a nineteenth embodiment of the present invention.
Figure 23:
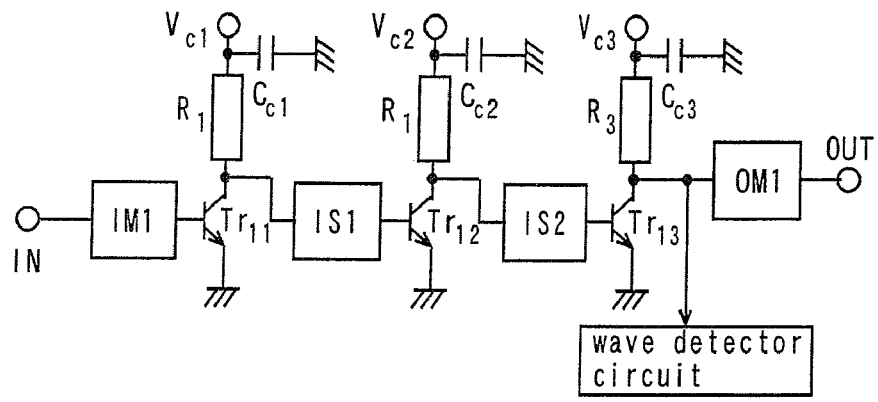
FIG. 23 is a circuit diagram of a GaAs-HBT power amplifier.
Figure 24:
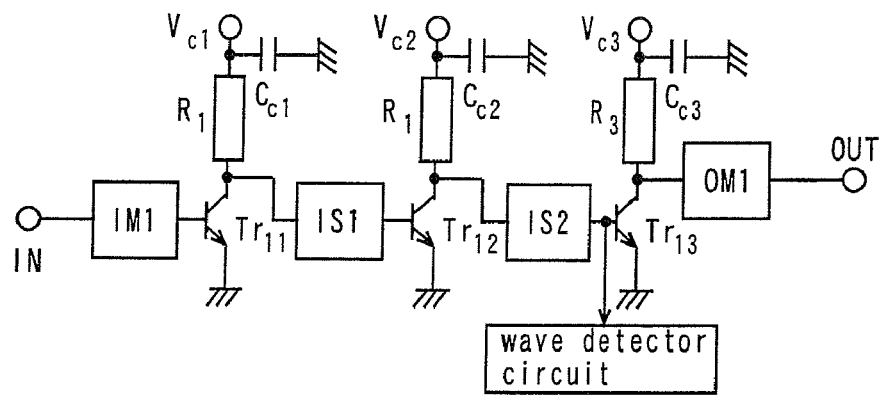
FIG. 24 is a circuit diagram of another GaAs-HBT power amplifier.
Figure 25:
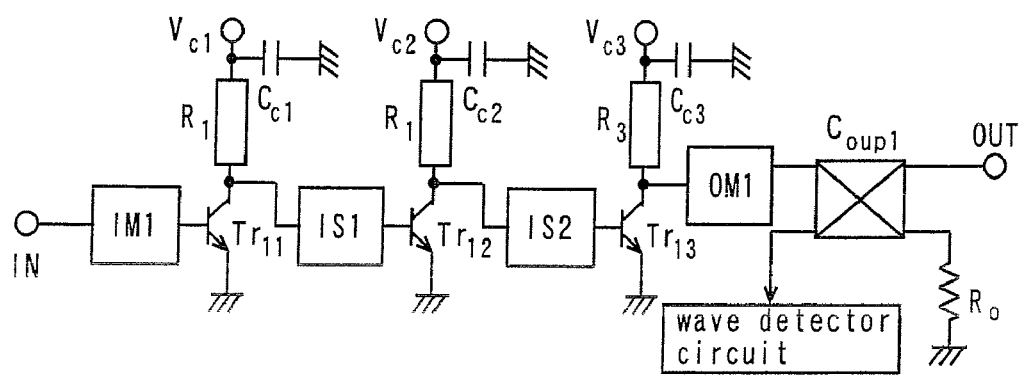
FIG. 25 is a circuit diagram of still another GaAs-HBT power amplifier.
Figure 26:
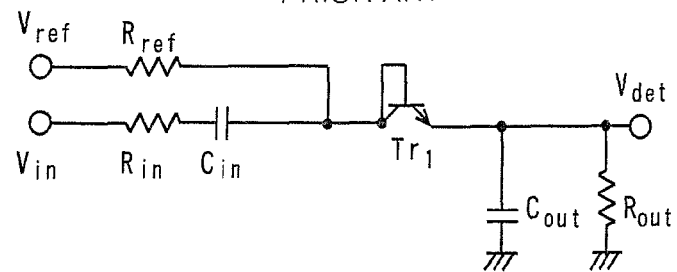
FIG. 26 is a circuit diagram of a conventional RF wave detector circuit.
Figure 27:
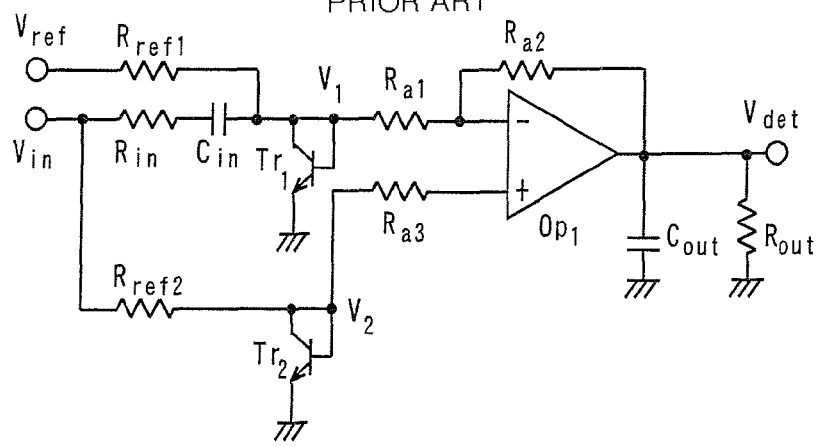
FIG. 27 is a circuit diagram of another conventional RF wave detector circuit.
Figure 28:
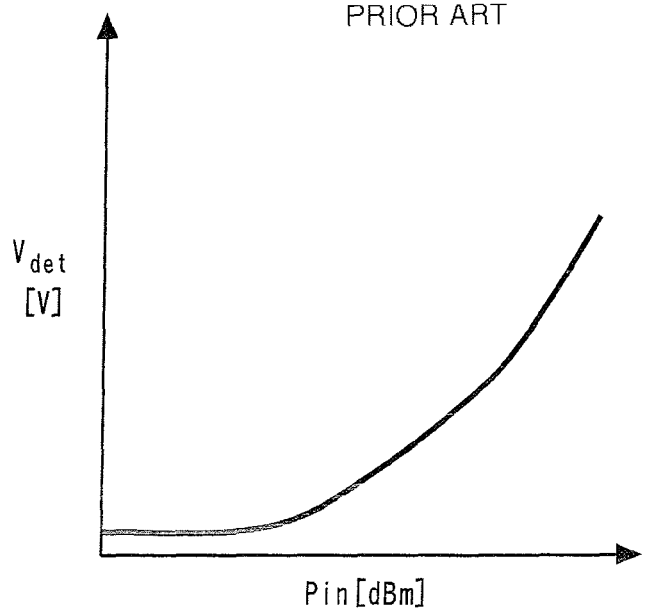
FIG. 28 is a diagram showing the input power vs. detected voltage characteristic of the circuits shown in FIGS. 26 and 27.

FIG. 22 is a top view showing an arrangement of a wave detector circuit and a three-stage power amplifier according to a nineteenth embodiment of the present invention. In the figure, symbols $Tr_{11}$, $Tr_{12}$, and $Tr_{13}$ denote GaAs-HBTs; IM1, IS1, IS2 and OM1, matching circuits; and DET, the wave detector circuit.

According to the present embodiment, any one of the wave detector circuits of the first to eighteenth embodiments is integrated on the same substrate as a GaAs-EBT power amplifier. The wave detector circuit DET (which is provided to monitor the RF power signal) performs RF detection on the base side of the final stage transistor $Tr_{13}$ of the power amplifier. The wave detector circuit DET is spaced apart from the base line of the final stage transistor $Tr_1$ of the power amplifier on the chip by a distance (d) of one-twentieth or less of the wavelength of the AC signal. This allows the parasitic inductance of the connection lines to be reduced such that variations in the detected voltage due to frequency changes are limited to a practically acceptable level.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-335861, filed on Dec. 13, 2006 including specification, claims, drawings and summary, on which the Convention priority of the present application is based, are incorporated herein by reference in its entirety.

What is claimed is:

1. A wave detector circuit comprising:
a first transistor having a base and a collector connected together, said first transistor receiving an AC signal having a wavelength and a reference voltage at said base and said collector;
a first resistor;
a second transistor having a base and a collector, said base of said second transistor being connected to said base of said first transistor through said first resistor, said second transistor outputting a detected voltage at said collector of said second transistor; and
a diode-connected temperature compensation transistor connected between ground potential and said base and said collector of said first transistor, wherein
said base of said second transistor is only connected to said first resistor, and
no reactive element is connected to said base of said first transistor or to said base of said second transistor that produces a frequency dependent connection between said base of said first transistor and said base of said second transistor.

2. The wave detector circuit as claimed in claim 1, further comprising a plurality of blocks, each block including said first transistor, said first resistor, and said temperature compensation transistor.

3. The wave detector circuit as claimed in claim 1, further comprising a plurality of blocks, each block including said second transistor and said first resistor.

4. The wave detector circuit as claimed in claim 1, wherein said first resistor has a variable resistance.

5. The wave detector circuit as claimed in claim 1, further comprising a second resistor connected to said base and said collector of said first transistor.

6. The wave detector circuit as claimed in claim 1, wherein said first resistor includes a transistor base layer.

7. The wave detector circuit as claimed in claim 1, wherein said first and second transistors form a current mirror circuit having an amplification rate of less than 1.

8. An integrated circuit comprising the wave detector circuit as claimed in claim 1,
a power amplifier; and
a substrate, wherein
said wave detector circuit is integrated on the same substrate as said power amplifier;
said wave detector circuit detects at a base side of a final stage transistor of said power amplifier, and
said wave detector circuit is spaced apart from a base line of said final stage transistor of said power amplifier by a distance one-twentieth or less of the wavelength of the AC signal.

9. A wave detector circuit comprising:
a first transistor having a base and a collector connected together, said first transistor receiving an AC signal and a reference voltage at said base and said collector;
a resistor;
a second transistor having a base and a collector, said base of said second transistor being connected to said base of said first transistor through said resistor, said second transistor outputting a detected voltage at said collector of said second transistor; and
a temperature compensation diode connected between ground potential and said base and said collector of said first transistor, wherein
said base of said second transistor is only connected to said resistor, and
no reactive element is connected to said base of said first transistor or to said base of said second transistor that produces a frequency dependent connection between said base of said first transistor and said base of said second transistor.

* * * * *